United States Patent [19]
Le Gal et al.

[11] Patent Number: 4,664,744
[45] Date of Patent: May 12, 1987

[54] PROCESS FOR THE PRODUCTION OF BISMUTH GERMANATE MONOCRYSTALS WITH A HIGH SCINTILLATION RESPONSE

[75] Inventors: Hervé Le Gal, St. Martin d'Héres; Jean L. Damelet, Jarrie, both of France

[73] Assignee: Crismatec, Gieres, France

[21] Appl. No.: 624,011

[22] Filed: Jun. 25, 1984

[30] Foreign Application Priority Data

Jul. 7, 1983 [FR] France ............................... 83 11349

[51] Int. Cl.$^4$ ............................................. C30B 29/08
[52] U.S. Cl. ...................... 156/616 R; 156/DIG. 67; 156/DIG. 79; 156/DIG. 83; 156/DIG. 89; 156/617 SP
[58] Field of Search ..... 156/616 R, 617 SP, DIG. 67, 156/DIG. 73, DIG. 79, DIG. 83, DIG. 89

[56] References Cited

U.S. PATENT DOCUMENTS 4,056,304 11/1977 Phillips .......................... 350/96 WG
4,444,728 4/1984 Lanam et al. ....................... 422/249

FOREIGN PATENT DOCUMENTS 2039868 8/1980 United Kingdom .
2115310 9/1983 United Kingdom .

OTHER PUBLICATIONS

Article entitled "Employment of Neutral Ambient Gas in Iridium Crucibles" by P. S. Yin, S. E. Blum, P. Chaudhari and D. F. O'Kane vol. 15, No. 5, Oct. 1972 of IBM Technical Disclosure Bulletin.
Institute of General and Inorganic Chemistry, Academy of Sciences of the USSR, Translated from Izvestiya Akademii Nauk SSSR, Neorganischeskie Materialy, vol. 3, No. 2, pp. 345-350, Feb. 1967, Original Article Submitted Dec. 25, 1965, Revision submitted Jun. 10, 1966.

*Primary Examiner*—David L. Lacey
*Attorney, Agent, or Firm*—Pearne, Gordon, McCoy & Granger

[57] ABSTRACT

Process for the production of bismuth germanate (BGO monocrystals) with a high scintillation response, based on the growth of a monocrystal from a molten bath in a crucible or container.

The container is made from iridium and the melting and growth are carried out under a neutral or weak oxidizing atmosphere. This process makes it possible to produce BGO monocrystals with a high scintillation response, of all random sizes, which are free from light diffusion centers and which can be used as high energy radiation detectors.

6 Claims, No Drawings

PROCESS FOR THE PRODUCTION OF BISMUTH GERMANATE MONOCRYSTALS WITH A HIGH SCINTILLATION RESPONSE

BACKGROUND OF THE INVENTION

The present invention relates to a process for the production of bismuth germanate monocrystals with a high scintillation response.

It more particularly applies to the field of producing scintillators used as high energy radiation detectors in medicine (tomoscanners, positron cameras), in high density physics and in oil and mining research.

Certain of these applications require large crystals (diameter > 50 mm, length > 200 mm) and in all cases an optimum luminous efficiency is required.

It is therefore necessary to avoid impurities, which can reduce the light emission intensity, as well as anything which is liable to reabsorb it during its path within the material (impurities, precipitates, various inclusions, etc).

The most widely used method for producing monocrystals of bismuth germanate (currently called BGO) is the Czochralski method. This is a pulling or drawing method consisting of raising to the boiling point ($T_F = 1050°$ C.) in a suitable crucible a polycrystalline charge close to the desired composition. A small monocrystalline bar of an appropriate size and orientation, called a germ, is then brought into contact with this molten bath. As from this time, a slow translation of this germ (a few mm/h) as well as a control of the crucible temperature permit the growth of a monocrystal having the desired geometry, provided that there is a suitable thermal environment and a satisfactory atmosphere.

At present, BGO monocrystals are produced using platinum crucibles and an oxidizing atmosphere.

Such a prior art BGO monocrystal production process is described in the article by O. H. NESTOR and C. Y. Huang (Harshaw Company) in IEEE Transactions on Nuclear Science, V45, 22, February 1975. This process makes it possible to obtain large monocrystals having scintillation properties. However, all these crystals have layers of macroscopic defects (blisters, inclusions, filaments, etc) which diffuse light, reduce the overall scintillation response and prejudice the homogeneity of the light response along the ingot.

Metallurgists are aware of the fact that the alloy Pt-Bi forms at 730° C. The melting point of BGO is 1050° C. making it necessary to use platinum crucibles under an oxidizing atmosphere to prevent the presence of bismuth metal. In spite of this, there is a corrosion of the crucible with accumulation of metallic impurities from the platinum within blister-type inclusions of the crystal.

Numerous scientific publications describe all the defects of monocrystals produced according to the said prior art process and the way in which the numbers therof can be reduced (for example K. TAKAGI, T. FUKAZAWA, M. ISHII, S. AKIYAMA (Hitachi), J. of Crystal Growth, 52, (1981), pp. 584-587).

These methods for improving the quality of BGO crystals, such as the use of pure starting substances, the growth of the crystals at a slow speed, successive crystallizations, large rotation of the crystal, etc are onerous and take a long time to perform, whilst only having a moderate effectiveness.

SUMMARY OF THE INVENTION

The problem of the invention is to obviate these disadvantages and more particularly to permit the production of BGO monocrystals of all sizes, which are free from light diffusing centers.

Specifically, the present invention relates to a process for the production of bismuth germanate monocrystals with a high scintillation response based on the growth of a monocrystal from a molten bath in a crucible or container, wherein the container is made from iridium and wherein melting and growth are performed under a neutral or weak oxidizing atmosphere.

According to another feature of this process, the partial oxygen pressure is equal to or below 1%.

The use of iridium crucibles for growing crystals is not novel and e.g. the article by P. S. YIN, S. E. BLUM, P. CHAUDHARI and D. F. O'KANE which appeared in the IBM Technical Disclosure Bulletin, Vol. 15, No. 5, October 1972 indicates the use of iridium crucibles for producing crystals of oxides having a high melting point, such as silicates. This article states that the crucibles suffer significant corrosion and that the material to be produced may be contaminated by the iridium. To obviate these disadvantages, it is proposed to work in a neutral atmosphere, e.g. in an argon atmosphere.

Moreover, U.S. Pat. No. 4,055,391 also describes in its introduction the defects of iridium crucibles. This material must be used at temperatures close to 1200° C. and is subject to significant corrosion. It is therefore frequently necessary to replace the crucibles, which is very costly.

However, contrary to what is taught in these documents, the inventors have shown that in the particular case of bismuth germanate very good results are obtained when working at temperatures below 1200° C. (approximately 1100° C. or even lower) and in a slightly oxidizing atmosphere. As the melting point of BGO is 1050° C., it is possible to work at temperatures of approximately 1100° C. and prevent reactions between bismuth and iridium which occur beyond 400° C. Moreover, it has been found that if the partial oxygen pressure is below 1%, only few iridium inclusions were detected in the crystals. However, with slightly higher partial oxygen pressures, the iridium quantities in the crystals are higher, but can still remain within acceptable limits, as a function of the envisaged use.

According to a preferred embodiment of the process according to the invention, the monocrystal is grown according to the Czochralski method.

According to another embodiment of the process according to the invention, the monocrystal is grown according to the molten zone method.

According to another embodiment of the process according to the invention, the monocrystal is grown according to the Bridgman method in vertical or horizontal geometry.

According to another feature of the process according to the invention, when a colouring appears on the ingot produced, annealing in air is carried out for a few hours in order to make the monocrystals colourless.

DETAILED DESCRIPTION OF THE INVENTION

Other features and advantages of the invention can be gathered from the following illustrative and non-limitative description.

A BGO monocrystal drawing campaign is carried out in accordance with the Czochralski method and serves to compare the effects of the following parameters:
platinum crucible and oxidizing atmosphere,
iridium crucible and weak oxidizing atmosphere ($P_{O_2} \leq 10^{-3}$ torr).

The other growth parameters were identical and it was revealed that iridium has a much more neutral chemical behaviour than platinum with respect to molten bismuth germanate. The iridium crucibles and the drawing conditions introduce no major cause of pollution, which is not the case with platinum.

It was found that the oxidizing atmosphere necessary for the use of a platinum crucible also greatly favours the evaporation of the bismuth oxide whereas, in a neutral or weak oxidizing atmosphere, there is a congruent evaporation of the bath. By analogy, the congruent composition is close to the stoichiometric composition and therefore the constitutional superfusion in the vicinity of the crystal growth interface is reduced.

The crystals produced from iridium crucibles and in a neutral or slightly oxidizing atmosphere are perfectly clear and transparent, whilst being free from macroscopic inclusions (blisters, filaments, etc), which are systematically observed in ingots drawn under an oxidizing atmosphere from a platinum crucible. Thus, their scintillation properties are improved. Moreover, the crystallization speed can be significantly increased under equivalent conditions (by a factor of 2 in the preceding example, although this result is not limitative).

When a colouring appears on the ingot produced under these conditions, annealing in air for a few hours is enough to make it colourless. However, it is not possible to eliminate by annealing the type of defect obtained under conventional conditions.

Finally, it has been found that there was very little corrosion of the iridium crucible, it being possible to carry out several dozen tests without any significant metal loss. This represents a major advantage, because iridium is very expensive and corrosion makes it necessary to frequently replace the crucibles.

The BGO monocrystal production process according to the invention can be used in all methods for growing monocrystals from the molten bath, preference being given to the Czochralski method. However, it is also possible to use the molten zone, the Bridgman method in vertical or horizontal geometry, or other similar methods.

Finally, it is easy to recognie crystals produced by the process according to the invention as a result of their iridium content. An overall analysis method (making it possible to analyze samples with a volume of 2 to 3 cm$^3$) demonstrated by BGO crystals produced according to the invention contained 7 p.p.m of platinum and 200 p.p.m. of iridium, whereas these contents were 150 and 20 p.p.m for crystals produced in platinum crucibles.

What is claimed is:

1. In a process for the production of a bismuth germanate monocrystal having a high scintillation response, said monocrystal being grown from a molten mass of bismuth germanate in a crucible or a container, the improvement comprising maintaining said molten mass within said crucible or said container during a melting and growing process, said crucible or said container consisting of iridium, and performing a melting and growing process in an atmosphere having a partial oxygen pressure equal to or below 1% of the total pressure.

2. A process according to claim 1, wherein the monocrystal is grown from the molten mass using a Czochralski pulling technique.

3. A process according to claim 1, wherein the monocrystal is grown from the molten mass using a molten zone technique.

4. A process according to claim 1, wherein the monocrystal is grown from the molten mass using a Bridgman technique in vertical or horizontal geometry.

5. A process according to claim 1, wherein, when a colouring appears on the monocrystal, annealing lasting a few hours in air is carried out in order to make the monocrystal colourless.

6. A process according to claim 1, wherein said bismuth germanate has a melting point of 1050° C., and the melting and growing process is performed at a temperature of about 1100° C.

* * * * *